United States Patent
Kitagawa et al.

(10) Patent No.: US 9,647,203 B2
(45) Date of Patent: May 9, 2017

(54) MAGNETORESISTIVE ELEMENT HAVING A MAGNETIC LAYER INCLUDING O

(71) Applicant: KABUSHIKI KAISHA TOSHIBA, Minato-ku, Tokyo (JP)

(72) Inventors: Eiji Kitagawa, Yokohama (JP); Minoru Amano, Sagamihara (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/333,069

(22) Filed: Jul. 16, 2014

(65) Prior Publication Data

US 2015/0263270 A1    Sep. 17, 2015

Related U.S. Application Data

(60) Provisional application No. 61/952,807, filed on Mar. 13, 2014.

(51) Int. Cl.
| | |
|---|---|
| *G11B 5/39* | (2006.01) |
| *H01L 43/10* | (2006.01) |
| *H01L 43/08* | (2006.01) |
| *G11C 11/16* | (2006.01) |
| *H01L 27/22* | (2006.01) |

(52) U.S. Cl.
CPC ............ *H01L 43/10* (2013.01); *G11B 5/3909* (2013.01); *G11C 11/161* (2013.01); *G11C 11/1673* (2013.01); *G11C 11/1675* (2013.01); *H01L 27/228* (2013.01); *H01L 43/08* (2013.01); *G11C 2213/74* (2013.01); *G11C 2213/79* (2013.01)

(58) Field of Classification Search
CPC .................................................... G11B 5/3909
USPC ................. 360/324.1, 324.11, 324.12, 324.2
See application file for complete search history.

(56) References Cited

U.S. PATENT DOCUMENTS

| | | | |
|---|---|---|---|
| 6,567,246 B1* | 5/2003 | Sakakima et al. ........ 360/324.11 |
| 7,394,626 B2* | 7/2008 | Fukumoto .............. B82Y 25/00 |
| | | | 257/E43.004 |
| 2002/0177013 A1* | 11/2002 | Hiramoto et al. ............ 428/702 |
| 2003/0231437 A1* | 12/2003 | Childress ............... B82Y 10/00 |
| | | | 360/324.12 |
| 2005/0259265 A1* | 11/2005 | De Lega ....................... 356/497 |
| 2006/0176620 A1* | 8/2006 | Ravelosona et al. ...... 360/324.2 |
| 2006/0221511 A1* | 10/2006 | Saruki .................... B82Y 10/00 |
| | | | 360/324.2 |
| 2007/0297099 A1* | 12/2007 | Hirata et al. ............... 360/324.2 |
| 2011/0007420 A1* | 1/2011 | Tsuchiya ................ B82Y 10/00 |
| | | | 360/234.3 |
| 2012/0070695 A1 | 3/2012 | Kitagawa et al. |
| 2012/0212857 A1* | 8/2012 | Fuji ..................... G11B 5/3909 |
| | | | 360/244 |
| 2013/0155764 A1* | 6/2013 | Noshiro ........................ 365/158 |
| 2013/0249026 A1 | 9/2013 | Kitagawa et al. |
| 2014/0131824 A1 | 5/2014 | Kitagawa et al. |

(Continued)

*Primary Examiner* — Jefferson Evans
(74) *Attorney, Agent, or Firm* — Holtz, Holtz & Volek PC

(57) ABSTRACT

According to one embodiment, a magnetoresistive element includes a first magnetic layer including O and one of Co, Fe, Ni and Mn, a second magnetic layer, a nonmagnetic layer between the first and second magnetic layers, a first electrode connected to the first magnetic layer, a second electrode connected to the second magnetic layer, and a resistive layer including N between the first magnetic layer and the first electrode.

19 Claims, 11 Drawing Sheets

(56) References Cited

U.S. PATENT DOCUMENTS

2015/0118520 A1* 4/2015 Ahn ...................... G11B 5/332
  428/815

* cited by examiner

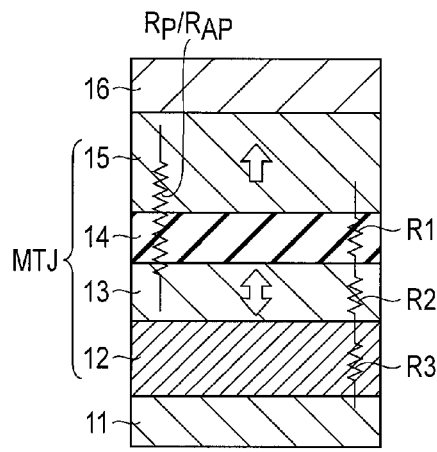
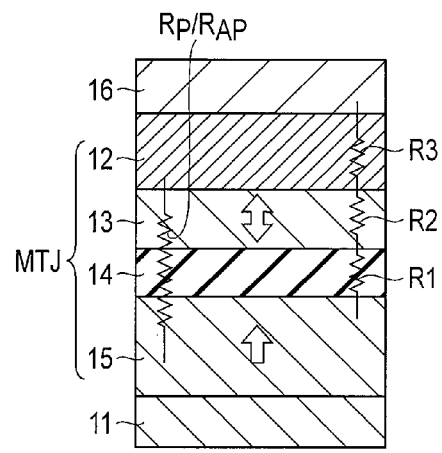
FIG. 1A    FIG. 1B
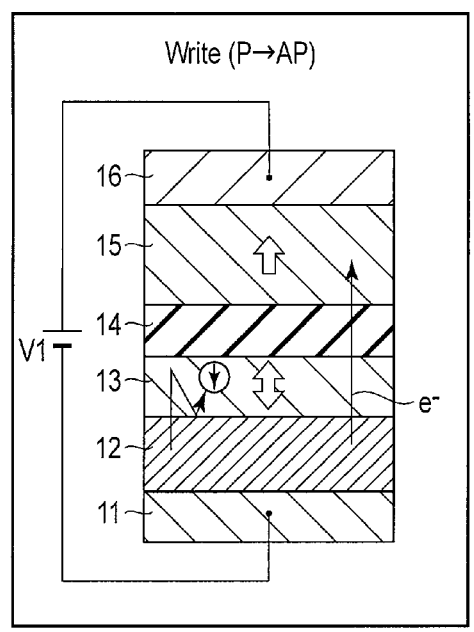
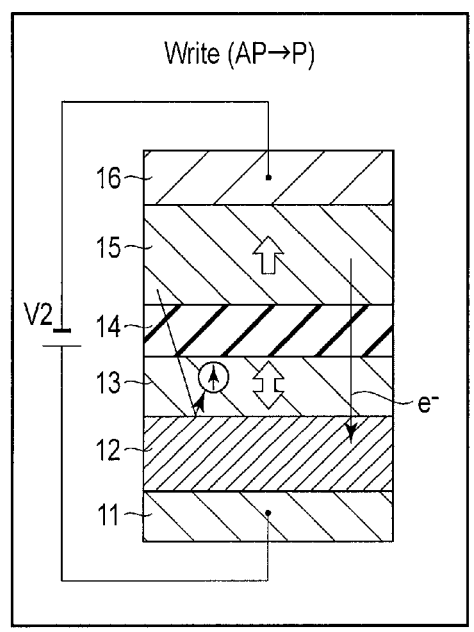
FIG. 2    FIG. 3

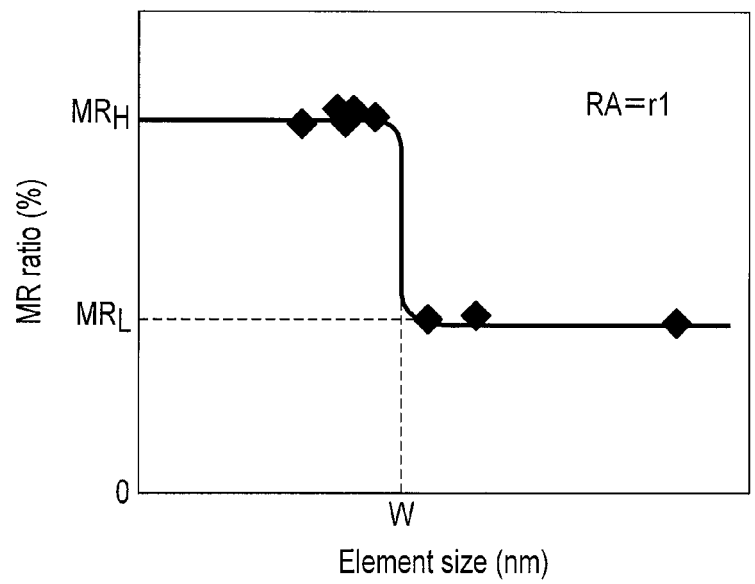
F I G. 4
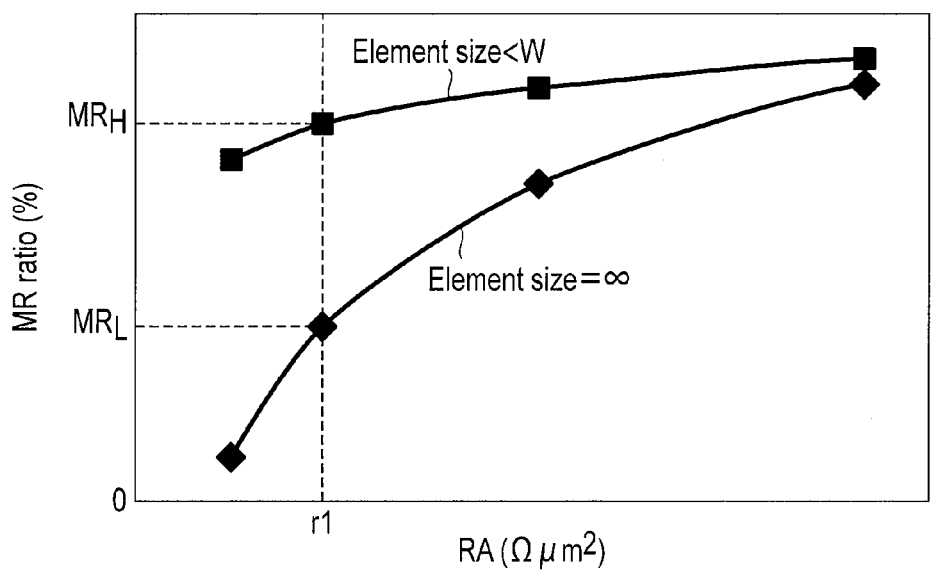
F I G. 5

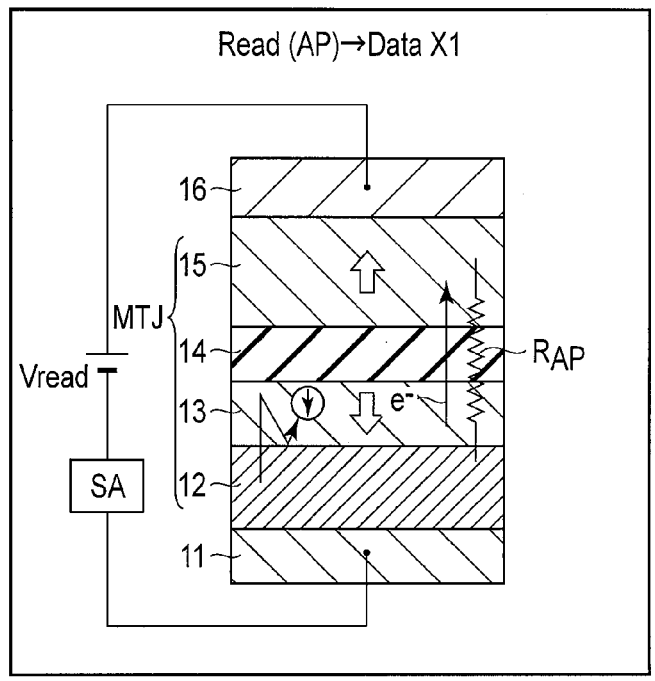
F I G. 6
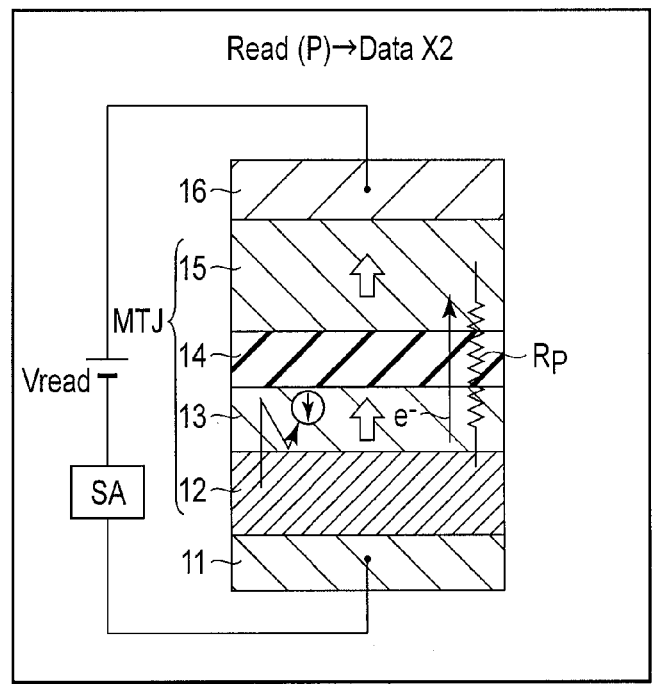
F I G. 7

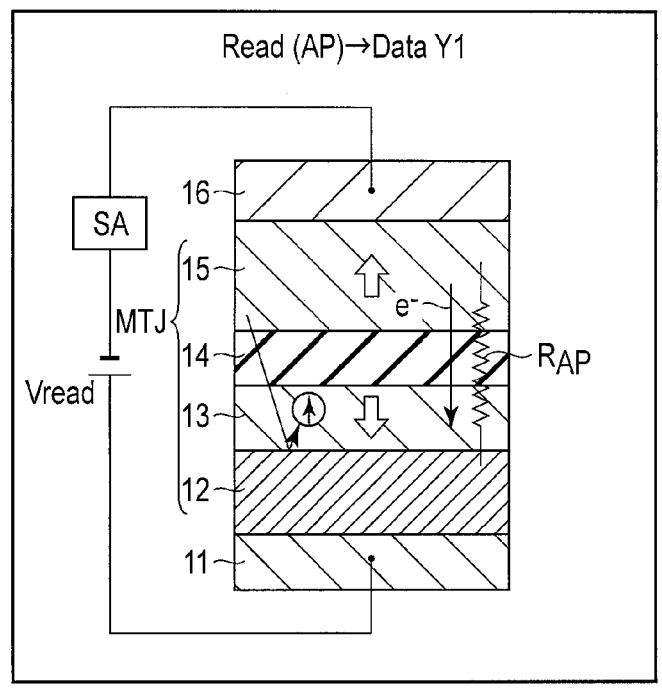
F I G. 8
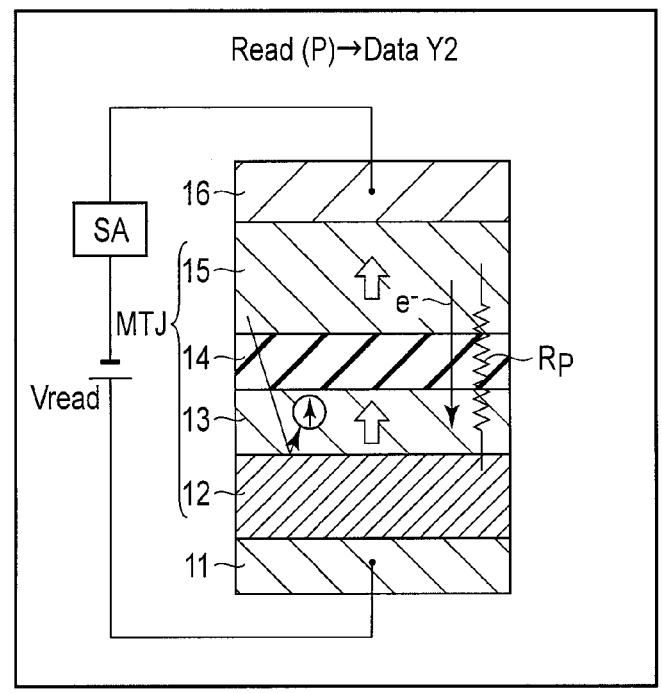
F I G. 9

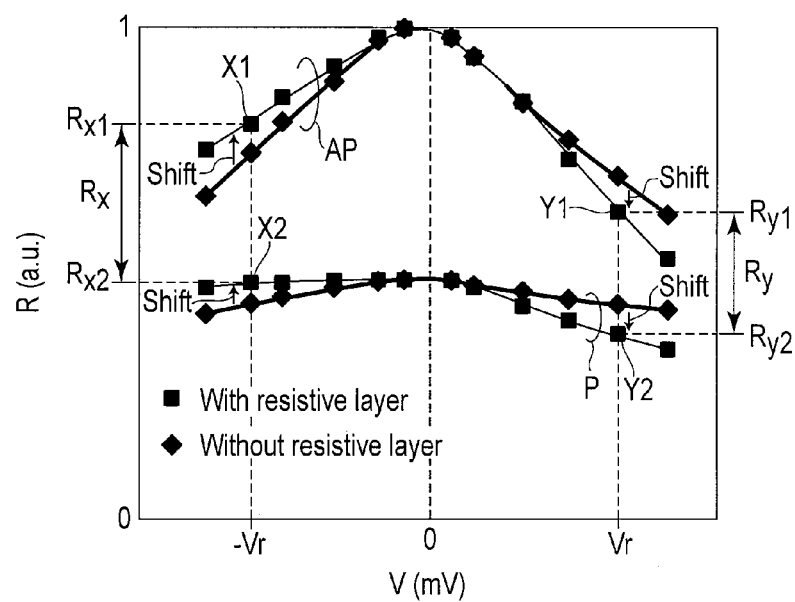
FIG. 10
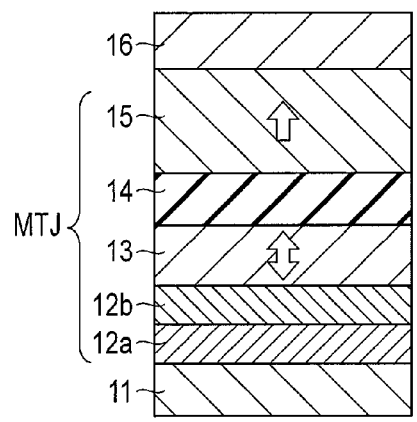 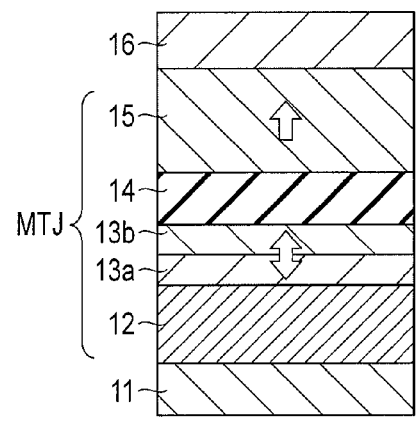
FIG. 11          FIG. 12

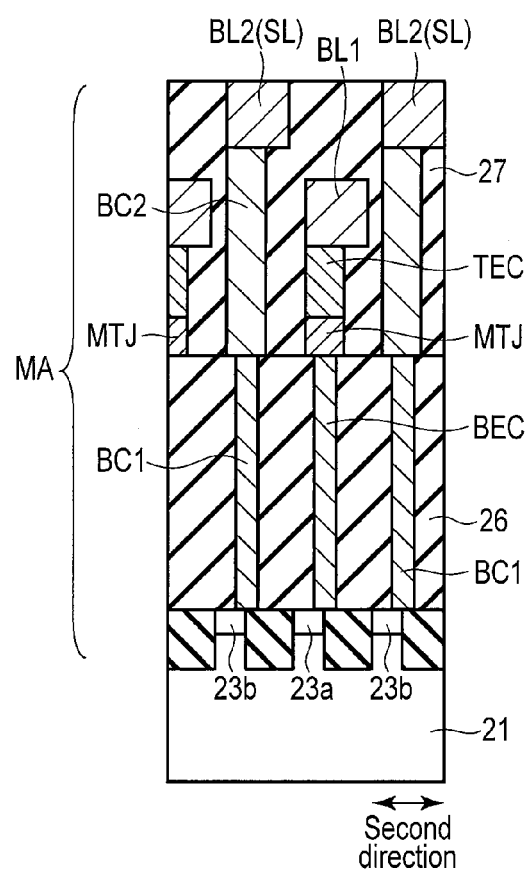
F I G. 21
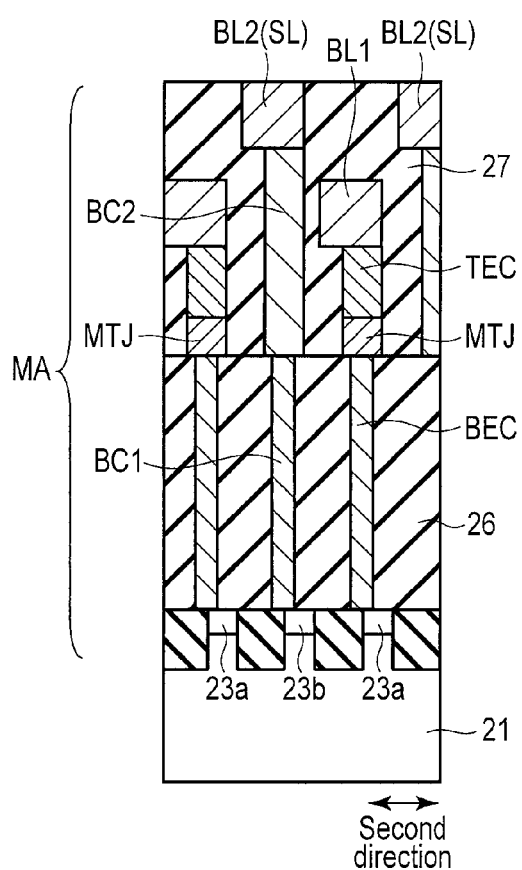
F I G. 22

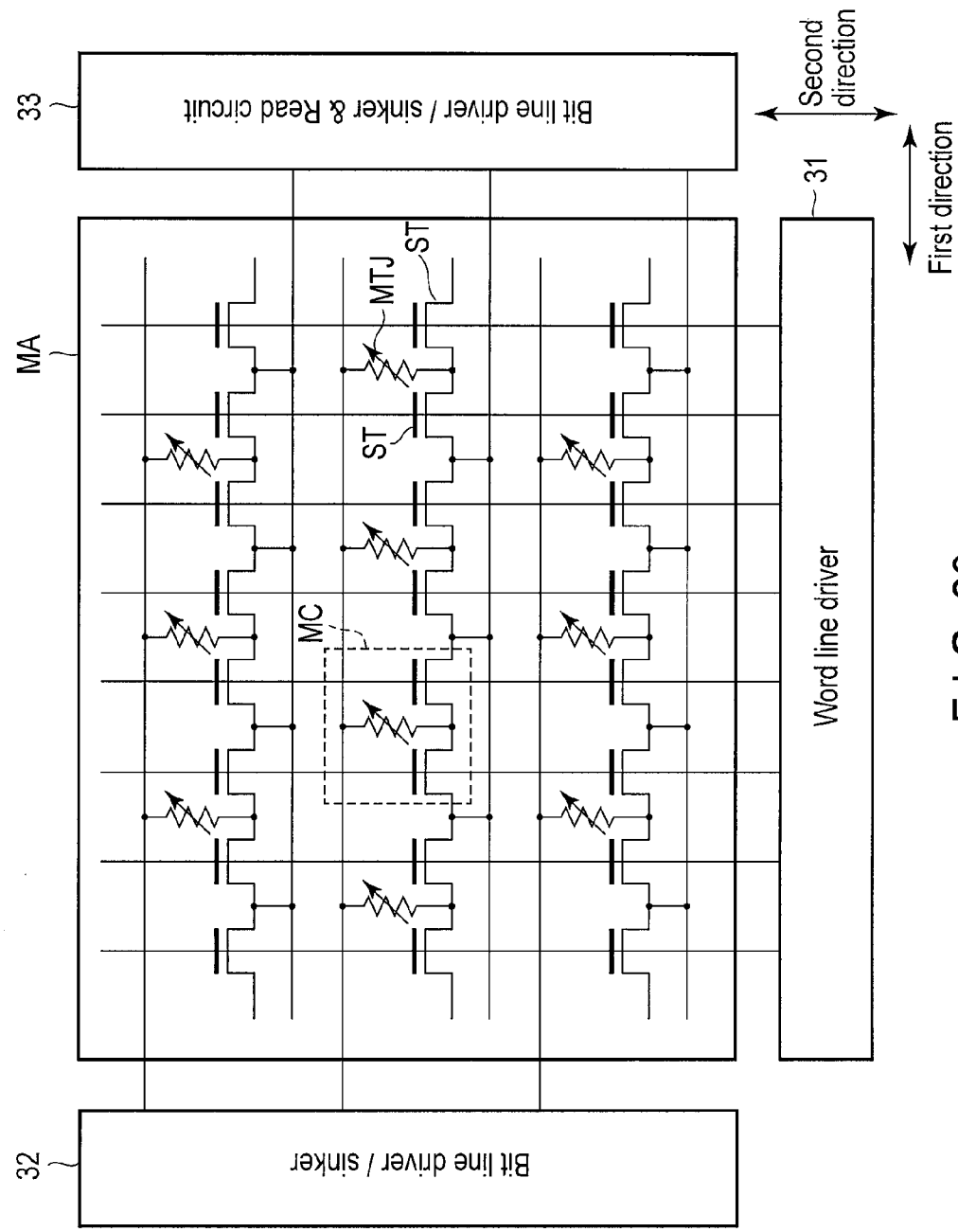
F I G. 23

MAGNETORESISTIVE ELEMENT HAVING A MAGNETIC LAYER INCLUDING O

CROSS-REFERENCE TO RELATED APPLICATIONS

This application claims the benefit of U.S. Provisional Application No. 61/952,807, filed Mar. 13, 2014, the entire contents of which are incorporated herein by reference.

FIELD

Embodiments described herein relate generally to a magnetoresistive element.

BACKGROUND

Because of the magnetoresistive effect, the resistance of a magnetoresistive element changes depending on the relative magnetization directions of a reference layer and a storage layer. For example, when the magnetization directions of the reference layer and storage layer are the same as each other (parallel state), the resistance of the magnetoresistive element is low. When the magnetization directions of the reference layer and storage layer are opposite to each other (anti-parallel state), the resistance of the magnetoresistive element is high. If the resistance in the parallel state is represented by $R_P$, and the resistance in the anti-parallel state is represented by $R_{AP}$, the value defined by $(R_{AP}-R_P)/R_P$ is called an MR ratio.

The MR ratio of a magnetoresistive element is preferably as large as possible to realize high reliability and high-speed performance. Therefore, the crystal structures of the reference layer, tunnel barrier layer and storage layer are formed as continuous. However, each of these layers is extremely thin; for example, each layer is a few nm thin. Thus, in fact, the theoretical MR ratio cannot be obtained. To compensate for this reduction in MR ratio, the enhancement of performance of a sense amplifier and the differential read technique which stores one bit in two magnetoresistive elements, etc., are adopted.

However, these techniques generate new problems such as increased chip size, power consumption and manufacturing cost.

BRIEF DESCRIPTION OF THE DRAWINGS

FIG. 1A and FIG. 1B are cross-sectional views showing a magnetoresistive element according to an embodiment.

FIG. 2 and FIG. 3 show examples of a write operation.

FIG. 4 shows the relationship between element size and MR ratio.

FIG. 5 shows the relationship between element resistance and MR ratio.

FIG. 6 to FIG. 9 show examples of a read operation.

FIG. 10 shows VR characteristics of the magnetoresistive element.

FIG. 11 and FIG. 12 are cross-sectional views showing modification examples of the magnetoresistive element.

FIG. 21 is a cross-sectional view taken along the line XXI-XXI of FIG. 19.

FIG. 22 is a cross-sectional view taken along the line XXII-XXII of FIG. 19.

FIG. 23 is a circuit diagram showing an equivalent circuit of the memory cell array of FIG. 19 to FIG. 22.

DETAILED DESCRIPTION

Figure 13:
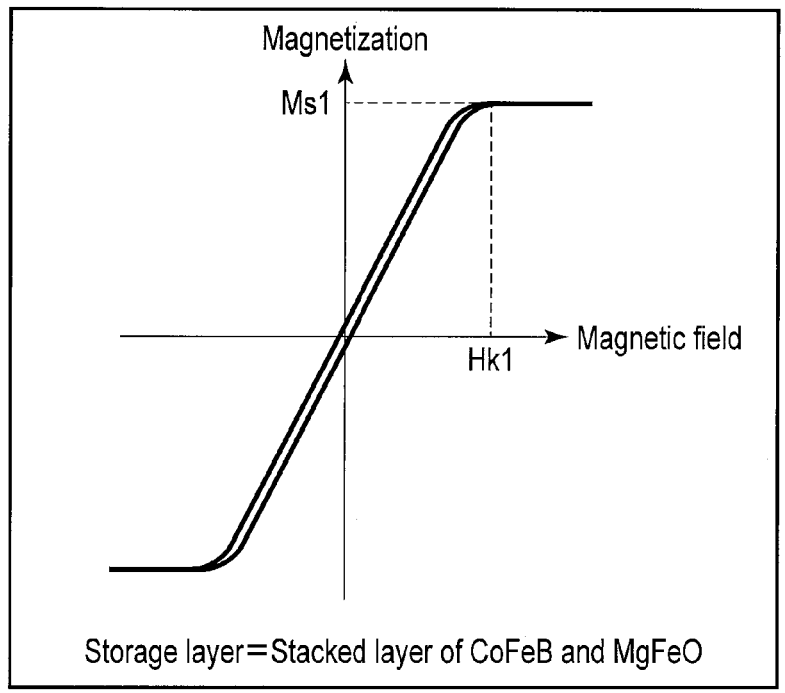
FIG. 13 and FIG. 14 show hysteresis curves of the magnetoresistive element.

In general, according to one embodiment, a magnetoresistive element comprises: a first magnetic layer including O and one of Co, Fe, Ni and Mn; a second magnetic layer; a nonmagnetic layer between the first and second magnetic layers; a first electrode connected to the first magnetic layer; a second electrode connected to the second magnetic layer; and a resistive layer including N between the first magnetic layer and the first electrode.

1. MAGNETORESISTIVE ELEMENT (1) Structure

FIG. 1A shows a first example of a magnetoresistive element.

A magnetoresistive element MTJ is provided on a first electrode 11. A second electrode 16 is provided on the magnetoresistive element MTJ.

The magnetoresistive element MTJ comprises a resistive layer 12 on the first electrode 11, a storage layer 13 on the resistive layer 12, a nonmagnetic layer (tunnel barrier layer) 14 on the storage layer 13 and a reference layer 15 on the nonmagnetic layer 14.

The storage layer 13 is a ferromagnetic layer having a variable magnetization. The reference layer 15 is a ferromagnetic layer having a constant magnetization. In this example, the storage layer 13 and the reference layer 15 have a perpendicular magnetization. However, instead of it, the storage layer 13 and the reference layer 15 may have an in-plane magnetization. Further, in this example, the magnetization of the reference layer 15 is fixed in the upward direction. However, the magnetization of the reference layer 15 may be fixed in the downward direction.

Here, constant magnetization means that the magnetization direction before and after writing is the same. Variable magnetization means that the magnetization direction before writing can change to the opposite direction after writing.

Writing refers to spin transfer writing which applies a spin torque to the magnetization of the storage layer by letting a spin injection current (spin-polarized electron) flow to the magnetoresistive element MTJ.

Perpendicular magnetization means that the storage layer 13 and the reference layer 15 have a remnant magnetization in the perpendicular direction in which the storage layer 13, the nonmagnetic layer 14 and the reference layer 15 are stacked. In-plane magnetization means that the storage layer 13 and the reference layer 15 have a remnant magnetization in the in-plane direction which is parallel to the top surfaces of the storage layer 13, the nonmagnetic layer 14 and the reference layer 15.

The resistance of the magnetoresistive element MTJ changes depending on the relative magnetization directions of the storage layer 13 and the reference layer 15 because of the magnetoresistive effect. For example, the resistance of the magnetoresistive element MTJ is low in the parallel state, and the resistance of the magnetoresistive element MTJ is high in the anti-parallel state.

The resistive layer 12 is, for example, a nitride. The resistive layer 12 is preferably the nitride of one of Al, Be, Mg, Ca, Sr, Ba, Sc, Y, La, Zr and Hf such as AlN, AlTiN and AlScN.

In the magnetoresistive element MTJ of this example, when the resistances of the nonmagnetic layer 14, the storage layer 13 and the resistive layer 12 are R1, R2 and R3 respectively, R1>R3>R2 is satisfied. As a result of this relationship, the MR ratio can be increased compared with a magnetoresistive element which does not comprise a resistive layer. This matter will be explained later.

Further, for the same reasons, in the magnetoresistive element MTJ, when the resistance of the magnetoresistive element MTJ in the low-resistance state (for example, parallel state) is $R_p$ and the resistance of the magnetoresistive element MTJ in the high-resistance state (for example, anti-parallel state) is $R_{AP}$, $R_{AP}>R_P>R3$ is preferably satisfied.

Moreover, $R3>R_P/MR$ is preferably satisfied. MR is a magnetoresistive ratio of the magnetoresistive element MTJ.

The first electrode 11 comprises one of Al, Be, Mg, Ca, Sr, Ba, Sc, Y, La, Zr and Hf, an alloy containing said one, or a chemical compound of said one and B (for example, HfB, MgAlB, HfAlB, ScAlB, ScHfB and HfMgB, etc.).

The second electrode 16 comprises, for example, W, Ta, Ru, Ti, TaN and TiN.

The second electrode 16 has the function as a mask for patterning the magnetoresistive element in addition to the function as an electrode. The second electrode 16 preferably comprises a material which has a low electric resistance and is excellent in diffusion resistance characteristics, etching resistance characteristics and milling resistance characteristics, etc., such as the lamination of Ta/Ru.

The storage layer 13 and the reference layer 15 contain the magnetic material of Co, Fe, Ni or Mn. Further, O (oxygen) may be contained in the magnetic material. In this case, the amount of oxygen within the storage layer 13 and the amount of the oxygen within the reference layer 15 may change.

In the storage layer 13, the amount of O in the area adjacent to the first electrode 11 (resistive layer 12) is preferably greater than the amount of O in the area adjacent to the nonmagnetic layer 14.

In the reference layer 15, the amount of O in the area adjacent to the second electrode 16 is preferably greater than the amount of O in the area adjacent to the nonmagnetic layer 14.

The storage layer 13 and the reference layer 15 may comprise, for example, CoFeB, MgFeO or the lamination of them.

In the case of the magnetoresistive element having the perpendicular magnetization, the storage layer 13 and the reference layer 15 preferably comprise TbCoFe having perpendicular magnetic anisotropy, an artificial lattice in which Co and Pt are accumulated, and L1o-ordered FePt, etc. In this case, CoFeB as an interface layer may be provided between the storage layer 13 and the nonmagnetic layer 14, or between the nonmagnetic layer 14 and the reference layer 15.

The nonmagnetic layer 14 comprises, for example, MgO and AlO, etc.

In this example, an underlayer may be provided between the first electrode 11 and the resistive layer 12 or between the resistive layer 12 and the storage layer 13. The underlayer allows the flat formation of the resistive layer 12 or the storage layer 13. The underlayer is preferably, for example, an alloy containing one of Al, Be, Mg, Ca, Sr, Ba, Sc, Y, La, Zr and Hf, or a boride. Further, for example, the inclusion of the same element in at least two layers adjacent to each other from the storage layer 13, the resistive layer 12, the first electrode 11 and the underlayer allows the magnetoresistive element in which the leakage characteristics have been improved. When the storage layer 13 comprises a material which mainly contains CoFeB containing boron, the resistive layer 12 or the storage layer 13 can be flattened by forming an underlayer containing boron.

FIG. 1B shows a second example of the magnetoresistive element.

The type of the magnetoresistive element MTJ of FIG. 1A is a top-pin type in which, for example, the reference layer 15 is upper than the storage layer 13 when the magnetoresistive element MTJ is formed on a semiconductor substrate. On the other hand, the type of the magnetoresistive element MTJ of FIG. 1B is a bottom-pin type in which, for example, the reference layer 15 is lower than the storage layer 13 when the magnetoresistive element MTJ is formed on the semiconductor substrate. In this respect, the magnetoresistive element MTJ of FIG. 1B is different from the magnetoresistive element MTJ of FIG. 1A.

The magnetoresistive element MTJ is provided on the first electrode 11. The second electrode 16 is provided on the magnetoresistive element MTJ.

The magnetoresistive element MTJ comprises the reference layer 15 on the first electrode 11, the nonmagnetic layer (tunnel barrier layer) 14 on the reference layer 15, the storage layer 13 on the nonmagnetic layer 14, and the resistive layer 12 on the storage layer 13.

Since the other structural elements are identical to the magnetoresistive element MTJ of FIG. 1A, such elements are designated by the same reference numbers and symbols in FIG. 1B as FIG. 1A. Thus, the detailed explanations of the elements are omitted.

(2) Write Operation

In the magnetoresistive element MTJ of FIG. 1A and FIG. 1B, a write operation is performed by letting a spin injection current (spin-polarized electron) flow to the magnetoresistive element MTJ. In this example, the write operation is explained based on the structure of FIG. 1A.

For example, as shown in FIG. 2, when the potential of the first electrode 11 is zero, and the potential of the second electrode 16 is plus potential V1, the spin injection current flows from the reference layer 15 to the storage layer 13. At this time, electrons e⁻ flow from the storage layer 13 to the reference layer 15. Relative to the magnetoresistive element MTJ in which the magnetization directions of the storage layer 13 and the reference layer 15 are stored in the same direction (in the parallel state), from the electrons from the storage layer 13 to the reference layer 15, electrons of the majority spin in the storage layer 13, in other words, electrons (upward) spin-polarized in the same direction as the magnetization (upward) of the reference layer 15 are accumulated within the reference layer 15. From the electrons from the storage layer 13 to the reference layer 15, electrons of the minority spin in the storage layer 13, in other words, electrons (downward) spin-polarized in the opposite direction of the magnetization (upward) of the reference layer 15 are returned to the storage layer 13 and apply a spin torque to the magnetization within the storage layer 13. Thus, the magnetization direction of the storage layer 13 is changed to the reverse (anti-parallel state) of the magnetization direction of the reference layer 15.

The resistive layer 12 comprises a material by which a spin pumping effect is small or is not caused. In short, the resistive layer 12 comprises a nitride. Therefore, the electrons of the minority spin, in other words, the electrons (downward) spin-polarized in the opposite direction of the magnetization (upward) of the reference layer 15 are accumulated within the storage layer 13 without being delivered to the resistive layer 12.

Therefore, before the magnetization of the storage layer 13 is inverted, in other words, when the magnetizations of the storage layer 13 and the reference layer 15 are parallel to each other, the spin polarizability of the storage layer 13 is substantially decreased. Since this decrease in spin polarizability disturbs the power distribution through a Δ1 band, the resistance of the magnetoresistive element MTJ is increased, and the conductance is reduced.

However, since the resistance of the nonmagnetic layer (tunnel barrier layer) 14 is reduced relative to the applied current (or voltage), substantially the resistance reduction ratio when the current (voltage) applied to the magnetoresistive element is increased is decreased.

On the other hand, after the magnetization of the storage layer 13 is inverted, in other words, when the magnetizations of the storage layer 13 and the reference layer 15 are anti-parallel to each other, the spin polarizability of the storage layer 13 is substantially increased. Since this increase in spin polarizability means the substantial increase in the barrier height of the nonmagnetic layer (tunnel barrier layer) 14, the resistance of the magnetoresistive element MTJ is increased, and the conductance is reduced. However, the resistance of the nonmagnetic layer (tunnel barrier layer) 14 is decreased relative to the applied current (or voltage). Therefore, substantially the resistance reduction ratio when the current (voltage) applied to the magnetoresistive element is increased is decreased.

When the resistive layer 12 is not present, the storage layer 15 comes in contact with the first electrode (for example, Ta) 11 having a large spin pumping effect. In this case, by the spin pumping effect, the electrons of the minority spin, in other words, the electrons (downward) spin-polarized in the opposite direction of the magnetization (upward) of the reference layer 15 are delivered to the first electrode 11 and disappear within the first electrode 11. For this reason, it is not possible to obtain the above-described effect in which the minority spin is accumulated within the storage layer 13. Thus, the increase in the resistance of the magnetoresistive element MTJ is inhibited. Alternatively, the resistance reduction ratio when the current (voltage) applied to the magnetoresistive element is increased is inhibited.

Thus, when a spin injection current flows from the second electrode 16 to the first electrode 11 in the magnetoresistive element MTJ, the resistance in the anti-parallel state of the magnetoresistive element MTJ comprising the resistive layer 12 is greater than the resistance in the anti-parallel state of the magnetoresistive element MTJ which does not comprise the resistive layer 12. The magnetoresistive elements MTJ are not different from each other except for the presence or absence of the resistive layer 12.

Further, for example, as shown in FIG. 3, when the potential of the first electrode 11 is plus potential V2 and the potential of the second electrode 16 is zero, the spin injection current flows from the storage layer 13 to the reference layer 15. At this time, electrons e⁻ flow from the reference layer 15 to the storage layer 13. From the electrons from the reference layer 15 to the storage layer 13, relative to the magnetoresistive element MTJ in which the directions of the magnetizations of the storage layer 13 and the reference layer 15 are stored in the opposite directions (in the anti-parallel state), electrons of the minority spin in the storage layer 13, in other words, electrons (upward) spin-polarized in the same direction as the magnetization (upward) of the reference layer 15 apply a spin torque in the same direction as the magnetization (upward) of the reference layer 15 to the magnetization within the storage layer 13. Thus, the magnetization direction of the storage layer 13 is changed to the same direction (parallel state) as the magnetization direction of the reference layer 15.

The resistive layer 12 comprises a material by which a spin pumping effect is small or is not caused. In short, the resistive layer 12 comprises a nitride. Thus, the electrons of the minority spin in the storage layer 13, in other words, the electrons (upward) spin-polarized in the same direction as the magnetization (upward) of the reference layer 15 are accumulated within the storage layer 13 without being delivered to the resistive layer 12.

Therefore, before the magnetization of the storage layer 13 is inverted, in other words, when the magnetizations of the storage layer 13 and the reference layer 15 are anti-parallel to each other, the spin polarizability between the storage layer 13 and the reference layer 15 is substantially decreased. Since this decrease in the spin polarizability means that the height of the nonmagnetic layer (tunnel barrier layer) 14 is substantially decreased, the resistance of the magnetoresistive element MTJ is decreased, and the conductance is increased. On the other hand, after the magnetization of the storage layer 13 is inverted, in other words, when the magnetizations of the storage layer 13 and the reference layer 15 are parallel to each other, the spin polarizability of the storage layer 13 is substantially increased. Since this increase in spin polarizability bumps up the power distribution through the Δ1 band, the resistance of the magnetoresistive element MTJ is decreased, and the conductance is increased.

When the resistive layer 12 is not present, the storage layer 15 comes in contact with the first electrode (for example, Ta) 11 having a large spin pumping effect. In this case, by the spin pumping effect, the electrons of the minority spin, in other words, the electrons (upward) spin-polarized in the same direction as the magnetization (upward) of the reference layer 15 are delivered to the first electrode 11 and disappear within the first electrode 11. Thus, it is not possible to obtain the above-described effect in which the minority spin is accumulated within the storage layer 13, and the decrease in the resistance of the magnetoresistive element MTJ is inhibited.

Thus, the resistance in the parallel state of the magnetoresistive element MTJ comprising the resistive layer 12 is less than the resistance in the parallel state of the magnetoresistive element which does not comprise the resistive layer. The magnetoresistive elements are no different from each other except for the presence or absence of the resistive layer 12.

In sum, when electrons e⁻ flow from the electrode 11 to the electrode 16, and the magnetizations of the storage layer 13 and the reference layer 15 are anti-parallel to each other, the barrier resistance is the highest. Further, since the state in which the barrier width is large is formed by the structure in which the magnetoresistive element MTJ comprises the resistive layer 12, the resistance in the anti-parallel state is extremely large compared with the magnetoresistive element which does not comprise the resistive layer. Thus, according to this embodiment, it is possible to improve the MR ratio of the magnetoresistive element without increasing the chip size, power consumption or manufacturing cost.

(3) Relationship Between Element Size and MR Ratio

FIG. 4 shows the relationship between the element size and the MR ratio.

In the figure, the element size is a size when the magnetoresistive element is viewed from the above. For example, when the magnetoresistive element is circular, the size refers to the diameter, and when the element is square, the size refers to the length of one side. Resistance RA of the magnetoresistive element is r1. Resistance RA of the magnetoresistive element is the average of the resistance in the anti-parallel state and the resistance in the parallel state.

As is clear from the figure, in the magnetoresistive element comprising the resistive layer (this embodiment), the element size is discontinuous in the border of threshold W. MR ratio $MR_H$ when the element size of the magnetoresistive element is less than threshold value W is greater than MR ratio $MR_L$ when the element size of the magnetoresistive element is greater than threshold W. This means that the effect of the increase in the MR ratio by the above accumulation effect of the spin is obtained when the element size of the magnetoresistive element is less than threshold W.

Although this threshold W differs depending on the material of the magnetoresistive element (including the resistive layer), threshold W is 90 nm or less in almost all of the assumable materials of the magnetoresistive element. Therefore, in order to obtain the effect of increase in the MR ratio of this embodiment, the size of the magnetoresistive element is preferably 90 nm or less.

FIG. 5 shows the relationship between resistance RA and MR ratio of the magnetoresistive element.

FIG. 5 reveals that the MR ratio when the element size of the magnetoresistive element is less than threshold W is greater than the MR ratio when the element size of the magnetoresistive element is infinite ($\infty$), in other words, when the magnetoresistive element is formed as a solid film on the semiconductor substrate (wafer).

For example, in the case where resistance RA of the magnetoresistive element is r1 (in the same case as FIG. 4), the MR ratio is $MR_L$ when the element size is infinite, and the MR ratio is $MR_H$ when the element size is less than threshold W.

This result conforms to the result of FIG. 4.

In FIG. 5A, RA ($\Omega\mu m^2$) is changed by fixing the film thickness of AlN and changing the film thickness of MgO in the magnetoresistive element MTJ using MgO for the nonmagnetic layer 14 and using AlN for the resistive layer 12. Thus, it is not possible to obtain the effect of improvement of MR ratio if MgO is thick and Ra is sufficiently large.

On the other hand, when the MgO film is thin, and the resistance of MgO is small and close to the resistance of AlN, the effect of improvement of MR ratio in association with miniaturization appears. In order to obtain the effect of improvement of MR ratio, $R3 > R_P/MR$ ratio is preferably satisfied. For example, when the MR ratio is 110% and RA is 5 $\Omega\mu m^2$, the resistance of the underlayer 11 is preferably 0.045 (=5/110) $\Omega\mu m^2$ or greater.

However, since the resistance of AlN is added to the resistance of MgO in series, the MR ratio is decreased. For this reason, the resistance of AlN needs to be small to some extent compared with the resistance of MgO. For example, when the resistance of AlN is less than or equal to 10% of resistance Rp of MgO, the reduction ratio of the MR ratio can be inhibited at 10% or lower.

In conclusion, the magnetoresistive element of this embodiment (FIG. 1A and FIG. 1B) is very effective in the case where a large-capacity memory is realized by arranging a plurality of magnetoresistive elements on a semiconductor substrate (wafer) in an array state as, for example, a magnetic random access memory.

(4) Read Operation

In the case where the structures (FIG. 1A and FIG. 1B) of this embodiment are used, the MR ratio is substantially changed depending on the orientation of the read current which flows through the magnetoresistive element in the read operation.

The conclusion is as follows: the read current preferably flows from the reference layer to the storage layer (resistive layer). In other words, electrons preferably flow from the storage layer (resistive layer) to the reference layer. The reason for this is that the MR ratio of the magnetoresistive element can be temporarily improved during the read operation by letting electrons flow from the storage layer (resistive layer) to the reference layer.

FIG. 6 and FIG. 7 illustrate examples in which a read current flows from the reference layer to the storage layer.

For example, as shown in these figures, when a sense amplifier SA is connected to the first electrode 11, and the potential of the second electrode 16 is read potential (plus potential) Vread, the read current flows from the reference layer 15 to the storage layer 13. At this time, electrons $e^-$ flow from the storage layer 13 toward the reference layer 15.

From the electrons from the storage layer 13 to the reference layer 15, the electrons of the minority spin, in other words, the electrons (upward) spin-polarized in the same direction as the magnetization (upward) of the reference layer 15 are accumulated within the reference layer 15. From the electrons from the storage layer 13 to the reference layer 15, the electrons of the majority spin, in other words, the electrons (downward) spin-polarized in the opposite direction of the magnetization (upward) of the reference layer 15 are returned to the storage layer 13 and apply a spin torque to the magnetization within the storage layer 13.

The resistive layer 12 comprises a material by which a spin pumping effect is small or is not caused. In short, the resistive layer 12 comprises a nitride. Therefore, the electrons of the majority spin, in other words, the electrons (downward) spin-polarized in the opposite direction of the magnetization (upward) of the reference layer 15 are accumulated within the storage layer 13 without being delivered to the resistive layer 12.

Therefore, as shown in FIG. 6, when the magnetoresistive element MTJ is in the anti-parallel state, the spin polarizability between the storage layer 13 and the reference layer 15 is substantially increased by the same principle as the write operation. Since this increase in spin polarizability means that the barrier height of the nonmagnetic layer (tunnel barrier layer) 14 is substantially increased, the resistance of the magnetoresistive element MTJ in the anti-parallel state (high-resistance state) is further increased, and the conductance is decreased. However, since the resistance of the nonmagnetic layer (tunnel barrier layer) 14 is reduced relative to the applied current (or voltage), substantially the resistance reduction ratio when the current (voltage) applied to the magnetoresistive element is increased is reduced.

Further, as shown in FIG. 7, when the magnetoresistive element MTJ is in the parallel state, by the same principle as the write operation, the spin poralizability between the storage layer 13 and the reference layer 15 is substantially reduced. Since this decrease in spin polarizability disturbs the power distribution through the Δ1 band, the resistance of the magnetoresistive element MTJ in the parallel state (low-resistance state) is increased, and the conductance is reduced. However, since the resistance of the nonmagnetic layer (tunnel barrier layer) 14 is decreased relative to the applied current (or voltage), substantially the resistance reduction ratio when the current (voltage) flowing through the magnetoresistive element is increased is decreased. However, the read current is sufficiently less than the write current. Therefore, in the read operation, an erroneous write (read disturbance) is not generated.

FIG. 8 and FIG. 9 show examples in which a read current flows from the storage layer to the reference layer.

For example, as shown in these figures, when the sense amplifier SA is connected to the second electrode 16 and the potential of the first electrode 11 is read potential (plus potential) Vread, the read current flows from the storage layer 13 to the reference layer 15. At this time, electrons e⁻ flow from the reference layer 15 to the storage layer 13. From the electrons from the reference layer 15 to the storage layer 13, the electrons of the minority spin, in other words, the electrons (upward) spin-polarized in the same direction as the magnetization (upward) of the reference layer 15 are accumulated within the reference layer 15, delivered to the storage layer 13 and apply a spin torque to the magnetization within the storage layer 13.

The resistive layer 12 comprises a material by which a spin pumping effect is small or is not caused. In short, the resistive layer 12 comprises a nitride. For this reason, the electrons of the minority spin, in other words, the electrons (upward) spin-polarized in the same direction as the magnetization (upward) of the reference layer 15 are accumulated within the storage layer 13 without being delivered to the resistive layer 12.

Thus, as shown in FIG. 8, when the magnetoresistive element MTJ is in the anti-parallel state, by the same principle as the write operation, the spin polarizability between the storage layer 13 and the reference layer 15 is substantially reduced. Since this decrease in spin polarizability substantially diminishes the thickness of the nonmagnetic layer (tunnel barrier layer) 14, the resistance of the magnetoresistive element MTJ in the anti-parallel state (high-resistance state) is decreased, and the conductance is increased. However, the read current is sufficiently less than the write current. Therefore, in the read operation, an erroneous write (read disturbance) is not generated.

As shown in FIG. 9, when the magnetoresistive element MTJ is in the parallel state, by the same principle as the write operation, the spin polarizability between the storage layer 13 and the reference layer 15 is substantially increased. Since this increase in spin polarizability bumps up the power distribution through the Δ1 band, the resistance of the magnetoresistive element MTJ in the parallel state (low-resistance state) is further decreased, and the conductance is increased.

FIG. 10 shows the relationship between the orientation or magnitude of read potential Vread and the resistance of the magnetoresistive element.

FIG. 10 shows VR characteristics in which the results of FIG. 6 to FIG. 9 are summarized.

The horizontal axis V (mV) represents the orientation and magnitude of read potential Vread. The vertical axis represents resistance R of the magnetoresistive element.

With regard to the orientation of read potential Vread, the left side of the figure based on the zero-potential point (center) of Vread shows the characteristics of the magnetoresistive element when the potential of the first electrode 11 is zero and the potential of the second electrode 16 is read potential (plus potential) Vread (FIG. 6 and FIG. 7). The right side of the figure based on the zero-potential point (center) of Vread shows the characteristics of the magnetoresistive element when the potential of the second electrode 16 is zero and the potential of the first electrode 11 is read potential (plus potential) Vread (FIG. 8 and FIG. 9).

AP indicates the characteristics of the magnetoresistive element in the anti-parallel state, and P indicates the characteristics of the magnetoresistive element in the parallel state.

♦ is the characteristics of the magnetoresistive element which does not have the resistive layer (comparative example).

According to the figure, the VR characteristics are symmetrical relative to the zero-potential point (center) of Vread regardless of the orientation of the read current. The reason for this is that the phenomena of FIG. 6 to FIG. 9 are not substantially generated.

■ shows the characteristics of the magnetoresistive element which has the resistive layer (this embodiment).

According to the figure, the VR characteristics are asymmetrical relative to the zero-potential point (center) of Vread, depending on the orientation of the read current.

The reason for this is as follows. For example, in the case of FIG. 6 (data X1), the resistance of the magnetoresistive element in the anti-parallel state (high-resistance state) is substantially further increased (shifted) by the read current (electron stream from the storage layer to the reference layer). On the other hand, for example, in the case of FIG. 8 (data Y1), the resistance of the magnetoresistive element in the anti-parallel state (high-resistance state) is substantially decreased (shifted) by the read current (electron stream from the reference layer to the storage layer).

Further, for example, in the case of FIG. 7 (data X2), the resistance of the magnetoresistive element in the parallel state (low-resistance state) is substantially increased (shifted) by the read current (electron stream from the storage layer to the reference layer). On the other hand, for example, in the case of FIG. 9 (data Y2), the resistance of the magnetoresistive element in the parallel state (low-resistance state) is substantially further decreased (shifted) by the read current (electron stream from the reference layer to the storage layer).

Moreover, the following matters are revealed from the asymmetry of the VR characteristics.

Resistance $R_{x1}$ of the magnetoresistive element when the horizontal axis is $-Vr$, in other words, when read potential Vread of FIG. 6 is Vr (in the anti-parallel state), is greater than resistance $R_{Y1}$ of the magnetoresistive element when the horizontal axis is Vr, in other words, when read potential Vread of FIG. 8 is Vr (in the anti-parallel state). Similarly, resistance $R_{x2}$ of the magnetoresistive element when the horizontal axis is $-Vr$, in other words, when read potential Vread of FIG. 7 is Vr (in the parallel state), is greater than resistance $R_{Y2}$ when the horizontal axis is Vr, in other words, when read potential Vread of FIG. 9 is Vr (in the parallel state).

When the read currents (electron streams from the storage layer to the reference layer) shown in FIG. 6 and FIG. 7 flow, the difference $R_x$ between resistance $R_{x1}$ of the magnetoresistive element in the anti-parallel state and resistance $R_{x2}$ of the magnetoresistive element in the parallel state is greater than the magnetoresistive element which does not have the resistive layer. This means that the MR ratio $(R_{x1}-R_{x2})/R_{x2}$ of the magnetoresistive element becomes substantially large.

In general, the magnetization inversion current in the case of FIG. 2 is greater than the magnetization inversion current in the case of FIG. 3. Therefore, as mentioned in the early stage, the read current preferably flows from the reference layer to the storage layer (resistive layer) in terms of the erroneous write (read disturbance) prevention. This means that electrons preferably flow from the storage layer (resistive layer) to the reference layer.

2. MODIFICATION EXAMPLE

A modification example of the magnetoresistive elements of FIG. 1A and FIG. 1B is explained. Here, a modification example of the magnetoresistive element of FIG. 1A is explained. However, this modification example can be also applied to the magnetoresistive element of FIG. 1B in the similar manner.

FIG. 11 is characterized in that the resistive layer 12 of FIG. 1A has a multilayer structure comprising, for example, a first nitride 12a and a second nitride 12b.

In this case, the resistance of the second nitride 12b which comes in contact with the storage layer 13 is preferably higher than the resistance of the first nitride 12a. The reason for this is that, by this structure, the accumulation (confining effect) of the spin-polarized electrons in the storage layer 13 stands out in the write operation or read operation.

FIG. 12 is characterized in that the storage layer 13 of FIG. 1A has a multilayer structure comprising, for example, a first magnetic material 13a and a second magnetic material 13b. In this case, the storage layer 13 may have a stack structure in which the first magnetic material 13a and the second magnetic material 13b are repeated at n times (n is a natural number greater than or equal to 2).

The first magnetic material 13a is a magnetic material containing oxygen such as MgFeO, MgCoO, MgCoFeO, FeO, CoO and CoFeO. The second magnetic material 13b is CoFeB. When the resistance of the storage layer 13 is increased by using a magnetic material containing oxygen for the storage layer 13, the accumulation (confining effect) in the storage layer 13 stands out, and the resistance change in the parallel state and the anti-parallel state becomes large because of the high resistance due to the increase in barrier width in the anti-parallel state. Thus, a high MR ratio can be obtained.

However, similarly to the case of the resistive layer 12, when the resistance of the storage layer 13 is too high, the MR ratio is decreased since the resistance in series is applied to the resistance of the nonmagnetic layer 14. In order to inhibit this decrease in the MR ratio due to the resistance in series, the relationship of R1>R3>R2 is preferably satisfied.

FIG. 13 shows a hysteresis curve when the storage layer having a CoFeB/MgFeO structure is used and a magnetic field is applied in the in-plane direction.

The magnetic field in which the magnetization is saturated is Hk1, and the saturated magnetization is Ms1.

Figure 14:
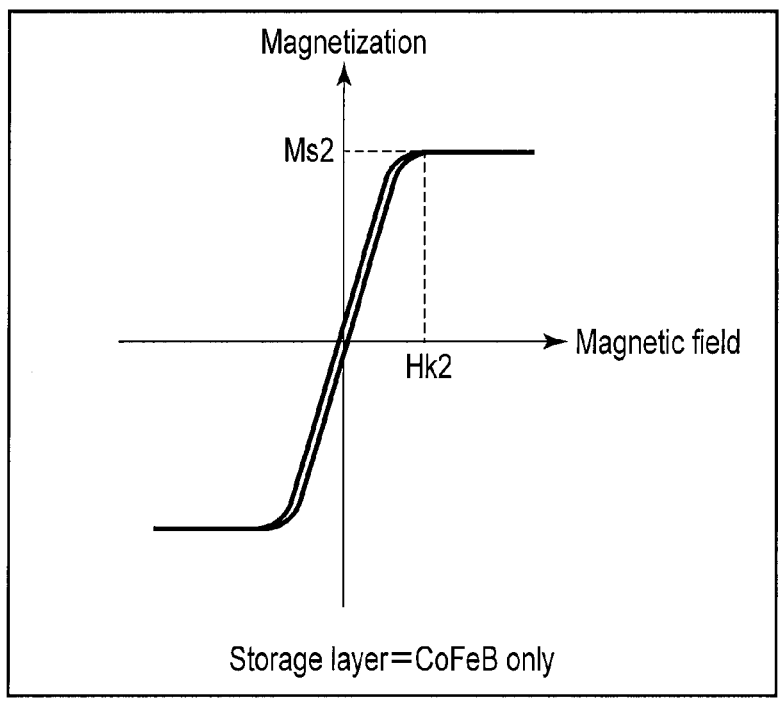

Similarly, FIG. 14 shows a hysteresis curve when the storage layer having only CoFeB is used and a magnetic field is applied in the in-plane direction.

When the magnetic field in which the magnetization is saturated is Hk2, and the saturated magnetization is Ms2, the relationship is shown by Hk1>Hk2 and Ms1>Ms2. Thus, the storage layer having a CoFeB/MgFeO structure has a larger saturated magnetic field and a larger saturated magnetization than the storage layer having only CoFeB. This means that the storage layer having a CoFeB/MgFeO structure has larger perpendicular magnetic anisotropy than the storage layer having only CoFeB.

Therefore, the lamination of the first magnetic material 13a as a magnetic material containing oxygen and the second magnetic material (for example, CoFeB) is preferably used for the storage layer of the magnetoresistive element.

However, the improvement of the MR ratio is obtained by using a magnetic material containing oxygen for the storage layer. Thus, the storage layer may comprise only a magnetic material containing oxygen.

3. APPLICATION EXAMPLE

Figure 15:
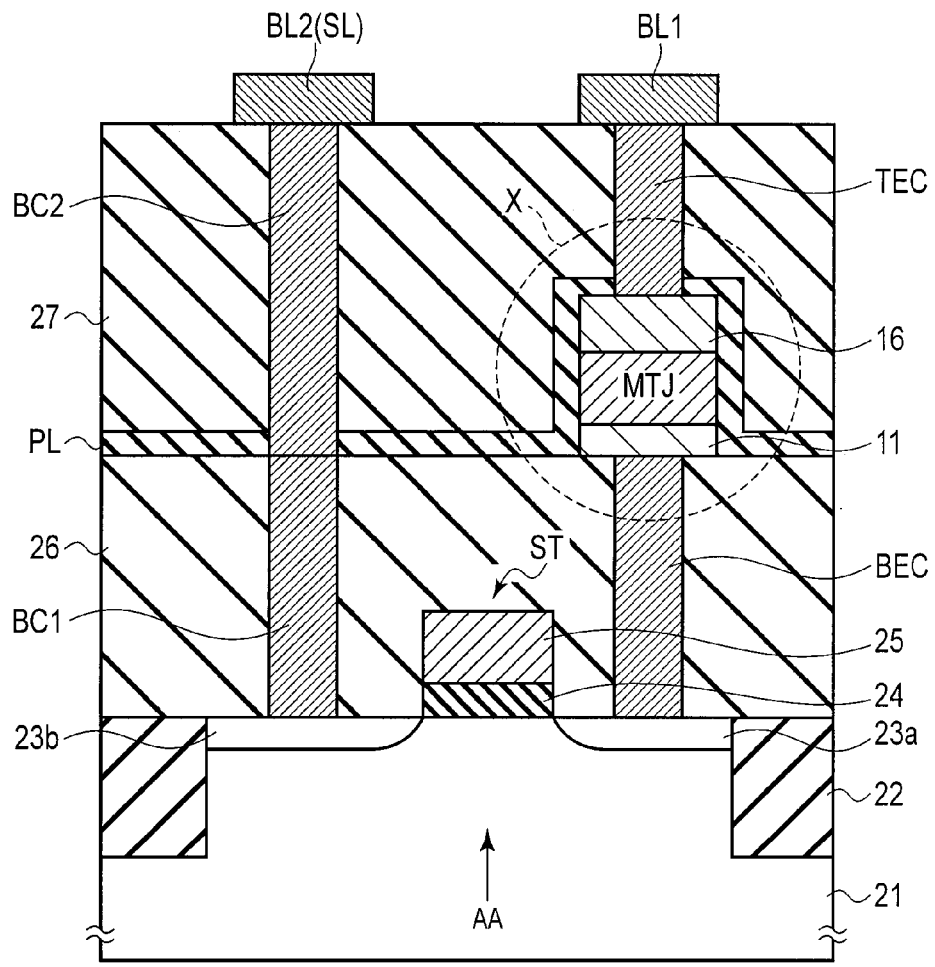
FIG. 15 is a cross-sectional view showing a memory cell as an application example.

FIG. 15 shows an example of a memory cell of a magnetic memory.

In this example, the memory cell of the magnetic memory comprises a selection transistor (for example, an FET) ST and a magnetoresistive element MTJ. The magnetoresistive element MTJ is the magnetoresistive element comprising the resistive layer in the above embodiment.

The selection transistor ST is provided within an active area AA within a semiconductor substrate 21. The active area AA is surrounded by an element separation insulating layer 22 within the semiconductor substrate 21. In this example, the element separation insulating layer 22 has a shallow trench isolation (STI) structure.

The selection transistor ST comprises source/drain diffusion layers 23a and 23b within the semiconductor substrate 21, a gate insulating layer 24 on the channel between the source/drain diffusion layers 23a and 23b, and a gate electrode 25 on the gate insulating layer 24. The gate electrode 25 functions as a word line.

An interlayer insulating layer (for example, an oxide silicon layer) 26 covers the selection transistor ST. Contact plugs BEC and BC1 are provided within the interlayer insulating layer 26. The upper surface of the interlayer insulating layer 26 is flat, and the lower part electrode (first electrode) 11 is provided on the interlayer insulating layer 26. The lower part electrode 11 is connected to the source/drain diffusion layer 23a of the selection transistor ST via the contact plug (bottom electrode contact) BEC. The contact plug BC1 is connected to the source/drain diffusion layer 23b of the selection transistor ST.

The magnetoresistive element MTJ is provided on the lower part electrode 11. The upper part electrode (second electrode) 16 is provided on the magnetoresistive element MTJ. For example, the upper part electrode 16 functions as a hard mask layer when the magnetoresistive element MTJ is processed.

A protection layer (for example, a nitride silicon layer) PL covers the side walls of the magnetoresistive element MTJ. An interlayer insulating layer (for example, an oxide silicon layer) 27 is provided on the protection layer and covers the magnetoresistive element MTJ. The upper surface of the interlayer insulating layer 27 is flat, and bit lines BL1 and BL2 are provided on the interlayer insulating layer 27. The bit line BL1 is connected to the upper part electrode 16 via a contact plug (top electrode contact) TEC. The bit line BL2 is connected to the contact plug BC1 via a contact plug BC2.

In this example, in the direction parallel to the top surface of the semiconductor substrate 11, the size of the magnetoresistive element MTJ is greater than that of the contact plug BEC.

Figure 16:
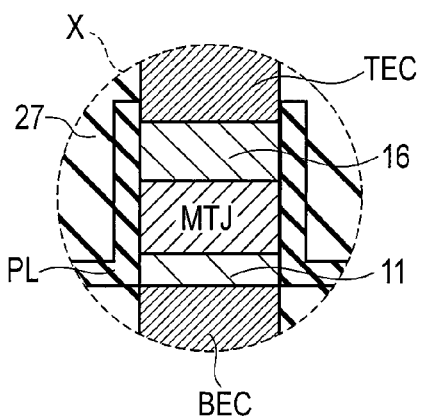
FIG. 16 and FIG. 17 are cross-sectional views showing modification examples of the area X of FIG. 15.
Figure 17:
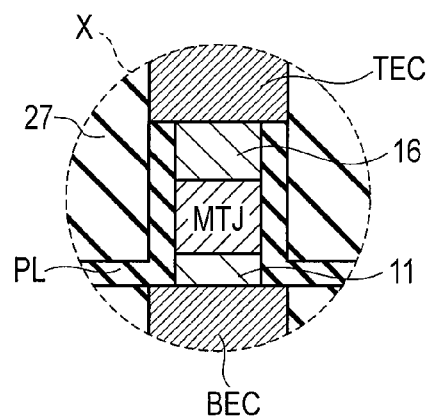

However, the size is not limited to this example. For example, as shown in FIG. 16, in the direction parallel to the top surface of the semiconductor substrate 11, the size of the magnetoresistive element MTJ may be the same as that of the contact plug BEC. As shown in FIG. 17, in the direction parallel to the top surface of the semiconductor substrate 11, the size of the magnetoresistive element MTJ may be less than that of the contact plug BEC.

Here, in FIG. 16 and FIG. 17, the area X corresponds to the area X of FIG. 15.

Figure 18:
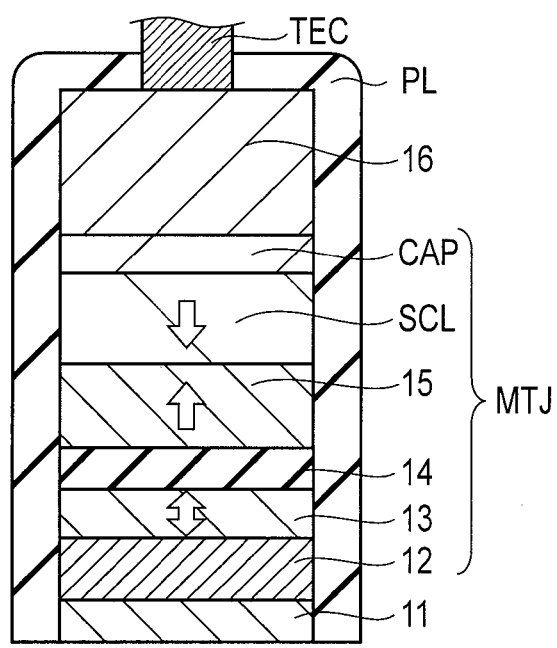
FIG. 18 is a cross-sectional view showing an example of the magnetoresistive element of FIG. 15.

FIG. 18 shows an example of the magnetoresistive element of FIG. 15 to FIG. 17.

This magnetoresistive element MTJ is different from the structures of FIG. 1A and FIG. 1B in respect that the magnetoresistive element MTJ comprises a shift cancellation layer SCL and a cap layer CAP. In the other respects, the magnetoresistive element MTJ is the same as FIG. 1A, FIG. 1B, FIG. 15, FIG. 16 and FIG. 17. Therefore, the structural elements identical to the elements disclosed in these figures are designated by the same reference numbers and symbols, and the detailed explanations of such elements will be omitted.

The shift cancellation layer SCL has a constant and perpendicular magnetization. The magnetization direction of the shift cancellation layer SCL is opposite to the magnetization direction of the reference layer 15. By this structure, the shift cancellation layer SCL cancels the shift of the magnetization inversion characteristics (hysteresis curve) of the storage layer 13 due to the stray magnetic field from the reference layer 15. The shift cancellation layer comprises, for example, CoPt, CoRh and CoPd, etc.

The cap layer CAP is provided between the shift cancellation layer SCL and the upper part electrode 16. The cap layer CAP comprises, for example, Pt, W, Ta and Ru, etc.

Figure 19:
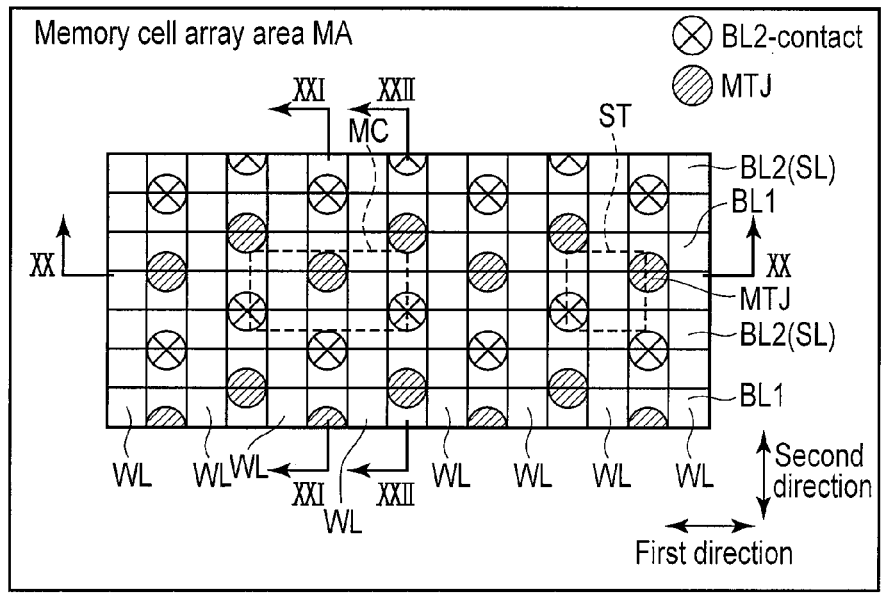
FIG. 19 is a plan view showing an example of a memory cell array.
Figure 20:
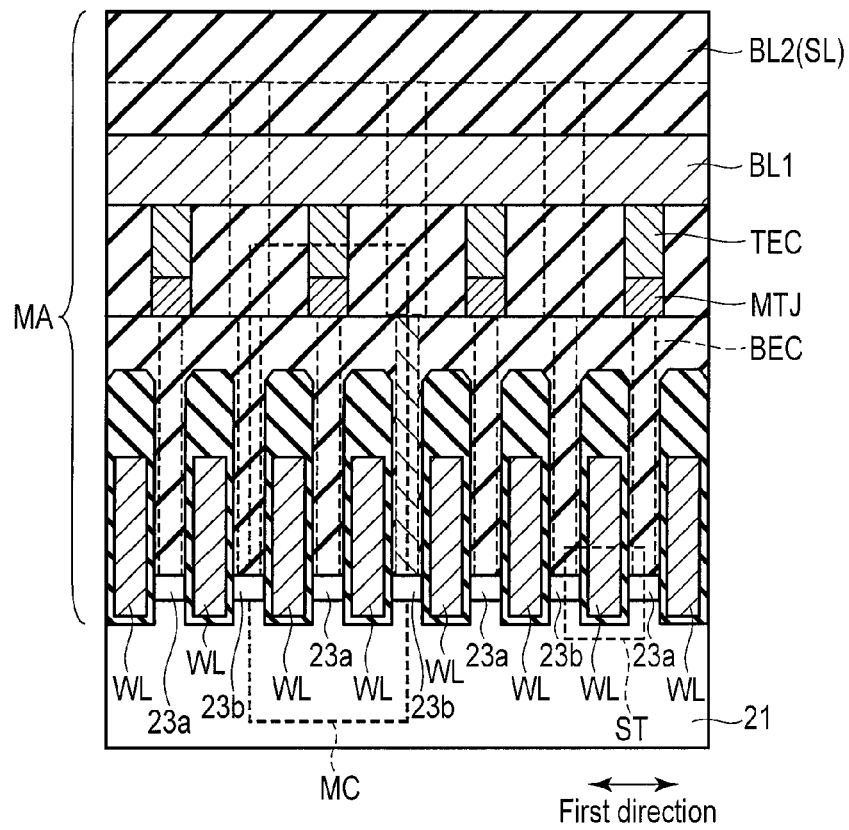
FIG. 20 is a cross-sectional view taken along the line XX-XX of FIG. 19.

FIG. 19 to FIG. 23 show examples of a memory cell array area of a magnetic random access memory. FIG. 19 is a plan view of the memory cell array area. FIG. 20 is a cross-sectional view taken along the line XX-XX of FIG. 19. FIG. 21 is a cross-sectional view taken along the line XXI-XXI of FIG. 19. FIG. 22 is a cross-sectional view taken along the line XXII-XXII of FIG. 19. FIG. 23 shows an equivalent circuit of the memory cell array area of FIG. 19 to FIG. 22.

In FIG. 19 to FIG. 22, the structural elements identical to FIG. 15 to FIG. 18 are designated by the same reference numbers and symbols.

In this example, a so-called two-transistor, one-element type is explained. In this type, one memory cell MC in a memory cell array area MA comprises two selection transistors ST and one magnetoresistive element MTJ. However, this does not mean that this embodiment is applied to only this type. This embodiment can be also applied to other types of memory cell array areas MA such as a one-transistor, one-element type and a cross-point type.

A plurality of memory cells MC are arranged in an array state on the semiconductor substrate 21. One memory cell MC comprises two selection transistors ST on the semiconductor substrate 11, and one magnetoresistive element MTJ connected to these two selection transistors ST in common.

Each selection transistor ST comprises the source/drain diffusion layers 23a and 23b within the semiconductor substrate 21, and a word line WL as a gate electrode on the channel between the source/drain diffusion layers 23a and 23b. The word line WL extends in the second direction and is connected to a word line driver 31.

The magnetoresistive element MTJ is provided on the source/drain diffusion layer 23a and is connected to the source/drain diffusion layer 23a. The bit line BL1 is provided on the magnetoresistive element MTJ and is connected to the magnetoresistive element MTJ. The bit line BL1 extends in the first direction and is connected to a bit line driver/sinker 32.

The bit line BL2 is provided on the source/drain diffusion layer 23b and is connected to the source/drain diffusion layer 23b. The bit line BL2 also functions as, for example, a source line SL connected to the sense amplifier in the read operation. The bit line BL2 extends in the first direction and is connected to the bit line driver/sinker and a read circuit 33.

The layout of the memory cell array area in this example is merely an example, and can be arbitrarily changed. For example, in this example, when the memory cell array area MA is viewed from the top of the semiconductor substrate 21, the location relationships among the source/drain diffusion layers 23a and 23b, the magnetoresistive element MTJ and the bit line BL1 are shifted in the second direction. However, the presence or absence of the shift, and the shift amount can be arbitrarily changed.

Further, in this example, the bit lines BL1 and BL2 are formed within wiring layers which are different from each other. However, the bit lines BL1 and BL2 may be formed within the same wiring layer.

4. METHOD OF MANUFACTURING MAGNETORESISTIVE ELEMENT

A method of manufacturing the magnetic memory of FIG. 15 to FIG. 18 is explained.

First, the selection transistor ST is formed on the semiconductor substrate 21. The interlayer insulating layer 26 covering the selection transistor ST is formed, and further, the contact plugs BEC and BC1 are formed. After that, the lower part electrode (first electrode) 11, the magnetoresistive element MTJ and the upper electrode (second electrode) 16 are formed on the contact plug BEC.

The magnetoresistive element MTJ is formed in accordance with the following steps.

As shown in FIG. 18, a lamination structure including the resistive layer 12, the storage layer 13, the nonmagnetic layer 14, the reference layer 15, the shift cancellation layer SCL and the cap layer CAP is formed on the lower electrode 11. The upper part electrode 16 as a hard mask layer is formed on the cap layer CAP.

After that, the patterning of the magnetoresistive element MTJ is executed.

For example, by using the upper part electrode 16 as a mask, ion beam etching (IBE) is applied to each of the cap layer CAP, the shift cancellation layer SCL, the reference layer 15, the nonmagnetic layer 14, the storage layer 13, the resistive layer 12 and the lower part electrode 11. The elements used for the ion beam of the IBE are, for example, Ne, Ar, Kr, Xe, N and O, etc.

At this time, in order to bring the shape of the magnetoresistive element MTJ close to the ideal shape, and in order to prevent the so-called re-deposition layer in the side walls of the nonmagnetic layer 14, the acceleration voltage of ions and the incident angle, etc., can be arbitrarily changed.

After this patterning, the re-deposition layer which adhered to the side walls of the nonmagnetic layer 14 may be insulated by conducting an oxidation treatment.

After that, the protection layer PL covering the magnetoresistive element MTJ is formed. The protection layer PL is preferably a layer configured to block oxygen, for example, a layer comprising a nitride such as SiN, AlN and HfN in order to, for example, prevent the magnetoresistive element MTJ from oxidation. The protection layer PL can be formed by the CVD method, the cyclic-CVD method and the ALD method, etc., at, for example, the temperature of or lower than 300° C.

Then, as shown in FIG. 15, the interlayer insulating layer 27 is formed on the protection layer PL. Within the interlayer insulating layer 27, the contact plugs TEC and BC2 are formed. At the end, on the interlayer insulating layer 27, the bit line BL1 connected to the contact plug TEC is formed, and the bit line BL2 (SL) connected to the contact plug BC2 is formed.

By the above manufacturing method, the magnetic memory shown in FIGS. 15 to 18 is manufactured.

5. CONCLUSION

According to this embodiment, it is possible to improve the MR ratio of the magnetoresistive element without increasing the chip size, power consumption or manufacturing cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a first magnetic layer including O and one of Co, Fe, Ni and Mn;
a second magnetic layer;
a nonmagnetic layer between the first and second magnetic layers;
a first electrode electrically connected to the first magnetic layer;
a second electrode electrically connected to the second magnetic layer; and
a resistive layer including N between the first magnetic layer and the first electrode.

2. The element of claim 1, wherein an amount of O in an area adjacent to the first electrode is greater than an amount of O in an area adjacent to the nonmagnetic layer.

3. The element of claim 1, wherein the first magnetic layer is a storage layer having a variable magnetization, and the second magnetic layer is a reference layer having an invariable magnetization.

4. The element of claim 1, wherein the resistive layer is a nitride, and R1>R3>R2 is satisfied, where R1 is a resistance of the nonmagnetic layer, R2 is a resistance of the first magnetic layer, and R3 is a resistance of the resistive layer.

5. The element of claim 4, wherein R3>$R_P$/MR is satisfied, where $R_P$ is a resistance of the element in a low-resistance state, and MR is a magnetoresistive ratio of the element.

6. The element of claim 4, wherein the element has a size of 90 nm or less in a direction perpendicular to a direction in which the first magnetic layer, the nonmagnetic layer, and the second magnetic layer are stacked.

7. The element of claim 4, wherein electrons flow from the first magnetic layer to the second magnetic layer in a read operation.

8. The element of claim 4, wherein the resistive layer comprises the nitride of one of Al, Be, Mg, Ca, Sr, Ba, Sc, Y, La, Zr, and Hf.

9. The element of claim 4, wherein the resistive layer comprises a first nitride and a second nitride between the storage layer and the first nitride, and the second nitride has a resistance higher than a resistance of the first nitride.

10. The element of claim 1, wherein the first magnetic layer is provided on the resistive layer, the nonmagnetic layer is provided on the first magnetic layer, and the second magnetic layer is provided on the nonmagnetic layer.

11. A magnetoresistive element comprising:
a first magnetic layer;
a second magnetic layer;
a nonmagnetic layer between the first and second magnetic layers;
a first electrode electrically connected to the first magnetic layer;
a second electrode electrically connected to the second magnetic layer; and
a resistive layer between the first magnetic layer and the first electrode,
wherein $R_{x1}$>$R_{y1}$ is satisfied when a relative magnetization direction between the first and second magnetic layers is constant, where $R_{x1}$ is a resistance of the element when a potential of the first electrode is lower than a potential of the second electrode, and $R_{y1}$ is the resistance of the element when the potential of the second electrode is lower than the potential of the first electrode.

12. The element of claim 11, wherein the first magnetic layer is a storage layer having a variable magnetization, and the second magnetic layer is a reference layer having a constant magnetization.

13. The element of claim 11, wherein the resistive layer comprises a nitride, and R1>R3>R2 is satisfied, where R1 is a resistance of the nonmagnetic layer, R2 is a resistance of the first magnetic layer, and R3 is a resistance of the resistive layer.

14. The element of claim 11, wherein R3>$R_P$/MR is satisfied, where $R_P$ is the resistance of the element in a low-resistance state, and MR is a magnetoresistive ratio of the element.

15. The element of claim 11, wherein the element has a size of 90 nm or less in a direction perpendicular to a direction in which the first magnetic layer, the nonmagnetic layer, and the second magnetic layer are stacked.

16. The element of claim 11, wherein $R_x$>$R_y$ is satisfied, where $R_x$ is a difference between $R_{x1}$ and $R_{x2}$ when the potential of the first electrode is lower than the potential of the second electrode, $R_y$ is a difference between $R_{y1}$ and $R_{y2}$ when the potential of the second electrode is lower than the potential of the first electrode, each of $R_{x1}$ and $R_{y1}$ is a resistance of the element in an anti-parallel state, and each of $R_{x2}$ and $R_{y2}$ is a resistance of the element in a parallel state, and
wherein electrons flow from the first magnetic layer to the second magnetic layer in a read operation.

17. The element of claim 11, wherein the resistive layer comprises a nitride of one of Al, Be, Mg, Ca, Sr, Ba, Sc, Y, La, Zr, and Hf.

18. The element of claim 11, wherein the resistive layer comprises a first nitride and a second nitride between the first magnetic layer and the first nitride, and the second nitride has a resistance higher than a resistance of the first nitride.

19. The element of claim 11, wherein the first magnetic layer is provided on the resistive layer, the nonmagnetic layer is provided on the first magnetic layer, and the second magnetic layer is provided on the nonmagnetic layer.

* * * * *